(12) United States Patent
Chang et al.

(10) Patent No.: US 7,655,556 B2
(45) Date of Patent: Feb. 2, 2010

(54) INTERCONNECT STRUCTURES FOR SEMICONDUCTOR DEVICES

(75) Inventors: Hui-Lin Chang, Hsin-Chu (TW); Hung Chun Tsai, Hsin-Chu (TW); Yung-Cheng Lu, Taipei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 198 days.

(21) Appl. No.: 11/738,982

(22) Filed: Apr. 23, 2007

(65) Prior Publication Data

US 2008/0233745 A1 Sep. 25, 2008

Related U.S. Application Data

(60) Provisional application No. 60/919,650, filed on Mar. 23, 2007.

(51) Int. Cl.
*H01L 21/4763* (2006.01)
(52) U.S. Cl. .................. 438/630; 438/626; 438/627; 438/687; 438/762; 438/767; 257/E21.579
(58) Field of Classification Search ......... 438/627–628, 438/653–655, 687; 256/762, 767, E21.579
See application file for complete search history.

(56) References Cited

U.S. PATENT DOCUMENTS

| | | | | |
|---|---|---|---|---|
| 5,126,574 A | * | 6/1992 | Gallagher | 250/492.2 |
| 5,403,779 A | | 4/1995 | Joshi et al. | |
| 6,046,108 A | * | 4/2000 | Liu et al. | 438/687 |
| 6,071,808 A | * | 6/2000 | Merchant et al. | 438/633 |
| 6,136,682 A | * | 10/2000 | Hegde et al. | 438/622 |
| 6,287,970 B1 | * | 9/2001 | Merchant et al. | 438/687 |
| 6,368,961 B1 | * | 4/2002 | Lopatin et al. | 438/653 |
| 6,521,523 B2 | | 2/2003 | Lee et al. | |
| 6,607,976 B2 | * | 8/2003 | Chen et al. | 438/627 |
| 6,660,634 B1 | | 12/2003 | Ngo et al. | |
| 2002/0055223 A1 | * | 5/2002 | Kutsunai et al. | 438/241 |
| 2007/0075428 A1 | | 4/2007 | Wang et al. | |

* cited by examiner

*Primary Examiner*—Charles D Garber
*Assistant Examiner*—Yasser A Abdelaziez
(74) *Attorney, Agent, or Firm*—Slater & Matsil, L.L.P.

(57) ABSTRACT

A cap layer for a copper interconnect structure formed in a first dielectric layer is provided. In an embodiment, the cap layer may be formed by an in-situ deposition process in which a process gas comprising germanium, arsenic, tungsten, or gallium is introduced, thereby forming a copper-metal cap layer. In another embodiment, a copper-metal silicide cap is provided. In this embodiment, silane is introduced before, during, or after a process gas is introduced, the process gas comprising germanium, arsenic, tungsten, or gallium. Thereafter, an optional etch stop layer may be formed, and a second dielectric layer may be formed over the etch stop layer or the first dielectric layer.

10 Claims, 3 Drawing Sheets

INTERCONNECT STRUCTURES FOR SEMICONDUCTOR DEVICES

This application claims the benefit of U.S. Provisional Application No. 60/919,650, filed on Mar. 23, 2007, entitled "Cu-M/Cu-MSi Formation Using Si Seed Catalysts," which application is hereby incorporated herein by reference.

TECHNICAL FIELD

The present invention relates generally to semiconductors and, more particularly, to a cap layer over a conductive layer in a semiconductor device.

BACKGROUND

Generally, integrated circuits (ICs) comprise electronic components, such as transistors, capacitors, or the like, formed on a substrate. One or more metal layers are then formed over the electronic components to provide connections between the electronic components and to provide connections to external devices. The metal layers typically comprise an inter-layer dielectric (ILD) layer in which interconnect structures, such as vias and conductive traces, are formed, usually with a single- or dual-damascene process.

The trend in the semiconductor industry is towards the miniaturization or scaling of integrated circuits, in order to provide smaller ICs and improve performance, such as increased speed and decreased power consumption. While aluminum and aluminum alloys were most frequently used in the past for the material of conductive lines in integrated circuits, the current trend is to use copper for a conductive material because copper has better electrical characteristics than aluminum, such as decreased resistance, higher conductivity, and a higher melting point.

The change in the conductive line material and insulating materials of semiconductor devices has introduced new challenges in the manufacturing process. For example, copper oxidizes easily and has a tendency to diffuse into adjacent insulating materials, particularly when a low-K material or other porous insulator is used for the ILD layer. To reduce these effects, attempts have been made to form a cap layer comprising a single layer of CoWP and CoB over the copper material. While the CoWP and CoB cap layers help reduce the oxidation and diffusion of the copper into the surrounding ILD layer, the CoWP and CoB cap layers require numerous processing steps and often result in metal residue on the surface of the ILD layer. These cap layers also exhibit poor resistance to oxygen and other chemicals, which may result in Rc yield loss and high contact resistance.

Accordingly, there is a need for a cap layer that eliminates or reduces surface migration and diffusion of the conductive material into adjacent insulating materials while being easily and efficiently formed.

SUMMARY OF THE INVENTION

These and other problems are generally solved or circumvented, and technical advantages are generally achieved, by preferred embodiments of the present invention which provides a cap layer over a conductive material in a semiconductor device.

In accordance with an embodiment of the present invention, a method for forming a cap layer is provided. The method comprises forming a first dielectric layer on a substrate, and an interconnect structure in the first dielectric layer. A cap layer is formed over the interconnect structure such that the cap layer comprises germanium, arsenic, tungsten, or gallium. The cap layer may be formed of a silicide by introducing silane before, during, or after introduction of a process gas comprising germanium, arsenic, tungsten, or gallium.

In accordance with another embodiment of the present invention, a cap layer comprising a copper alloy is formed over a copper interconnect, the copper alloy comprises germanium, arsenic, tungsten, or gallium. The cap layer may be formed of a silicide by introducing silane before, during, or after introduction of a process gas comprising germanium, arsenic, tungsten, or gallium.

In accordance with yet another embodiment of the present invention, a method of providing a copper-metal cap layer is provided. The copper-metal cap layer may be formed by forming a copper interconnect structure in a first dielectric layer and introducing a process gas comprising $GeH_4$, $AsH_3$, $GaH_3$, or $WF_6$ with a diluent gas comprising He, $H_2$, or $N_2$. The cap layer may be formed of a silicide by introducing silane before, during, or after introduction of a process gas comprising germanium, arsenic, tungsten, or gallium.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely forming copper interconnects in an intermetal dielectric layer. The invention may also be applied, however, to other designs in which it is desirable to limit contamination between materials or to increase adhesive qualities of successive layers.

Figure 1:
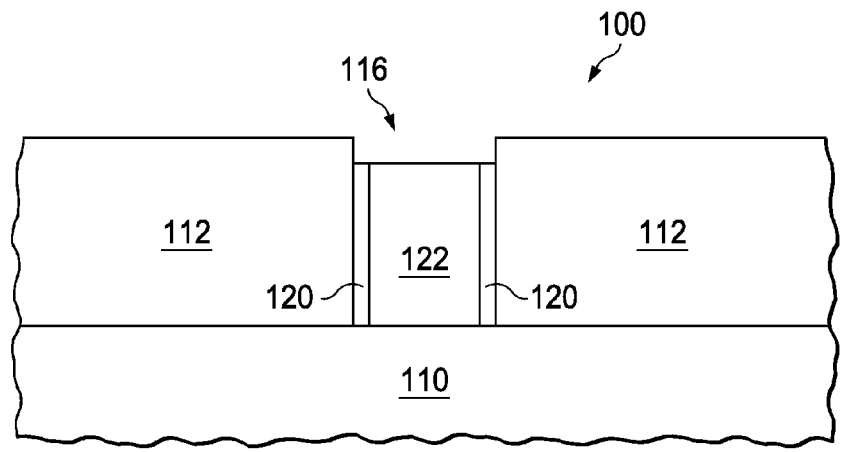
FIGS. 1-5 are cross-section views of a wafer during various steps of an embodiment of the present invention.

FIGS. 1-5 illustrate cross-section views of a first embodiment of the present invention in which a cap layer is formed on a metal layer. Referring first to FIG. 1, a workpiece 100 is provided. The workpiece 100 comprises a semiconductor substrate 110 having a first dielectric layer 112 formed thereon. The semiconductor substrate 110 may comprise silicon or other semiconductor materials. The semiconductor substrate 110 may also include other active components or circuits (not shown). The workpiece 100 may include other conductive layers or other semiconductor elements, e.g. transistors, diodes, etc.

Generally, the first dielectric layer 112 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art. In an embodiment, the first dielectric layer 112 comprises an oxide that may be formed by chemical vapor deposition (CVD) techniques using tetra-ethyl-ortho-silicate (TEOS) and oxygen as a precursor. Other materials and processes may be used. It should also be noted that the first dielectric layer 112 may comprise a plurality of dielectric layers, with or without an etch stop layer formed between adjacent dielectric layers. The first dielectric layer 112 is preferably about 500 Å to about 5000 Å in thickness, but more preferably 2000 Å.

An opening 116 is formed in the first dielectric layer 112. The opening 116 may be a trench, via, or other pattern into which a conductive layer is to be formed. For example, in an embodiment, the opening 116 comprises a long thin trench that is relatively straight, or that curves and digresses in bends or other patterns to form conductive lines within a metal layer. In other embodiments, the opening 116 forms a via, contact plug, or other interconnect structure electrically coupled to electrical devices or other conductive lines formed on underlying layers.

The opening 116 may be formed by photolithography techniques known in the art. Generally, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing steps, such as etching, performed to form the opening 116 in the first dielectric layer 112. The etching process may be a wet or dry, anisotropic or isotropic, etch process, but preferably is an anisotropic dry etch process. After the opening 116 is formed in the first dielectric layer 112, the remaining photoresist, if any, may be removed. Other processes, such as electron beam lithography (EBL) or the like, may be utilized to form the opening 116.

It should be noted that the process discussed above described a single-damascene process for illustrative purposes only. Other processes, such as a dual-damascene process may be utilized in accordance with an embodiment of the present invention. For example, a dual-amascene process may be utilized to form a trench and a via through one or more layers of the first dielectric layer 112.

After the opening 116 is formed, an optional first barrier layer 120 is formed in the opening 116. The first barrier layer 120 may be formed of one or more adhesion layers and/or barrier layers. In an embodiment, the first barrier layer 120 is formed of one or more layers of conductive materials, such as titanium, titanium nitride, tantalum, tantalum nitride, or the like. In an exemplary embodiment, the first barrier layer 120 is formed of a thin layer of tantalum nitride and a thin layer of tantalum deposited by CVD techniques. In this embodiment, the combined thickness of the tantalum nitride and tantalum layers is about 50 Å to about 500 Å.

A conductive layer 122 is formed in the opening on the optional first barrier layer 120. The opening 116 may be filled with the conductive material by, for example, performing a blanket deposition process to a thickness such that the opening 116 is at least substantially filled. The conductive layer 122 may comprise metals, elemental metals, transition metals, or the like. In an exemplary embodiment, the conductive layer 122 is copper. The conductive layer 122 may also be formed by depositing a seed layer and performing an electro-chemical plating process.

A planarization process, such as a chemical-mechanical process (CMP), may be performed to planarize the surface and to remove excess deposits of the material used to form the first barrier layer 120 and the conductive layer 122 as illustrated in FIG. 1.

Furthermore, a preclean process may be performed to remove impurities along the surface of the conductive layer 122. The pre-clean process may be a reactive or a non-reactive pre-clean process. For example, a reactive process may include a plasma process using a hydrogen-containing plasma, and a non-reactive process may include a plasma process using an argon-containing or helium-containing plasma. The pre-clean process may also be a plasma process using a combination of the above gases.

In an embodiment in which the conductive layer 122 comprises copper, the pre-clean process may be performed using an $H_2$ plasma, such as $N_2NH_3$, $NH_3$, or the like, under a pressure of about 1 mTorr to about 10 Torr and a temperature of about 250° C. to about 400° C. Other processes and materials may be used.

Figure 2:
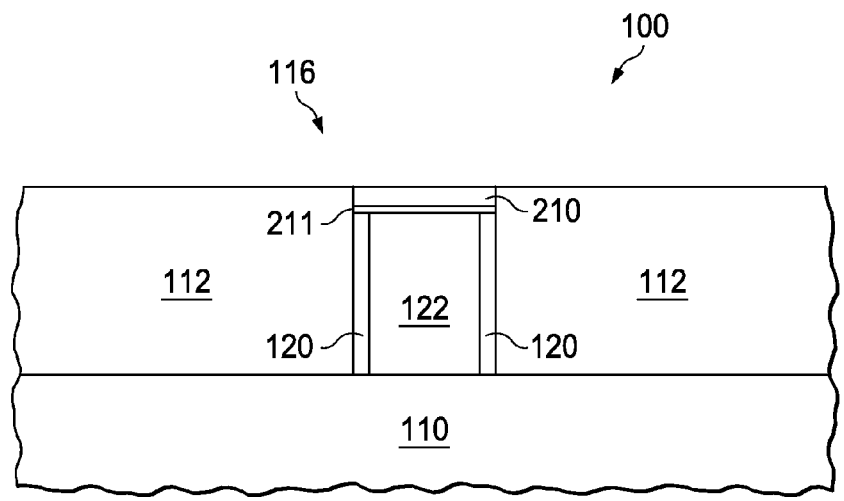

FIG. 2 illustrates the workpiece 100 after a cap layer 210 has been formed in accordance with an embodiment of the present invention. In an embodiment, the cap layer 210 comprises a copper-metal alloy. One of ordinary skill in the art will realize that the process described herein may be performed by in-situ deposition and does not necessarily require additional tools or equipment. Because of this, the cap layer 210 may be formed quickly and efficiently, thereby reducing costs.

For example, a cap layer 210 comprising a copper germanium alloy may be formed by introducing a process gas of $GeH_4$ with a diluent gas, such as He, $H_2$, $N_2$, or the like, at a ratio between about 1:100 to about 1:10, a pressure of about 1 mTorr to about 10 Torr, and a temperature of about 250° C. to about 400° C. As another example, a cap layer 210 comprising a copper arsenic alloy may be formed by introducing a process gas such as $AsH_3$, $ASCl_3$, or the like with a diluent gas, such as He, $H_2$, $N_2$, or the like, at a ratio between about 1:100 to about 1:10, a pressure of about 1 mTorr to about 10 Torr, and a temperature of about 250° C. to about 400° C. In yet another example, a cap layer 210 comprising a copper tungsten alloy may be formed by introducing a process gas such as $WF_6$, $W(Co)_6$ or the like with a diluent gas, such as He, $H_2$, $N_2$, or the like, at a ratio between about 1:100 to about 1:10, a pressure of about 1 mTorr to about 10 Torr, and a temperature of about 250° C. to about 400° C. In yet another example, a cap layer 210 comprising a copper gallium alloy may be formed by introducing a process gas such as $GaH_3$ or the like with a diluent gas, such as He, $H_2$, $N_2$, or the like, at a ratio between about 1:100 to about 1:10, a pressure of about 1 mTorr to about 10 Torr, and a temperature of about 250° C. to about 400° C.

In another embodiment, the cap layer 210 comprises a copper-metal silicide material. In this embodiment, silane ($SiH_4$) may be introduced before, during, or after the introduction of the process gas. The introduction of silane causes the selective formation of a silicon seed layer on the exposed copper of the interconnect structure and causes the formation of a copper-metal silicide cap layer. Generally, the seed layer (such as seed layer 211 illustrated in FIG. 2) comprises a thin atomic layer of a material to aid in the formation a thicker layer.

In an embodiment, the seed layer comprises a silicon seed layer formed by introducing $SiH_4$ or a silane-based gas (e.g., $SiH_6$) for a time period of about 4 seconds to about 10 seconds at a temperature of about 250° C. to about 400° C. prior to the introduction of a metal precursor. A dissociation process occurs that results in a thin atomic silicon seed layer being selectively deposited on the conductive layer 122. Thereafter, the metal precursor gas is introduced to form the copper-metal silicide cap layer 210. For example, a cap layer 210 comprising a copper germanium silicide may be formed by introducing a process gas of $GeH_4$, with a diluent gas, such as He, $H_2$, $N_2$, or the like, at a ratio of process gas mixture to diluent gas of between about 1:100 to about 1:10, a pressure of about 1 mTorr to about 10 Torr and a temperature of about 250° C. to about 400° C.

As another example, a cap layer 210 comprising a copper arsenic silicide may be formed by introducing a process gas of $AsH_3$ with a diluent gas, such as He, $H_2$, $N_2$, or the like, at a ratio of process gas mixture to diluent gas of between about 1:100 to about 1:10, a pressure of about 1 mTorr to about 10 Torr and a temperature of about 250° C. to about 400° C. In yet another example, a cap layer 210 comprising a copper tungsten silicide may be formed by introducing a process gas of $WH_6$ with a diluent gas, such as He, $H_2$, $N_2$, or the like, at a ratio of process gas mixture to diluent gas of about 1:100 to about 1:10, a pressure of about 1 mTorr to about 10 Torr and a temperature of about 250° C. to about 400° C. In yet another example, a cap layer 210 comprising a copper gallium silicide may be formed by introducing a process gas of $GaH_3$ with a diluent gas, such as He, $H_2$, $N_2$, or the like, at a ratio of process gas mixture to diluent gas of about 1:100 to about 1:10, a pressure of about 1 mTorr to about 10 Torr and a temperature of about 250° C. to about 400° C.

In yet another embodiment, a copper-metal silicide cap layer may be formed by simultaneously introducing a mixture of silane and a metal precursor. For example, a cap layer 210 comprising a copper germanium silicide may be formed by introducing a process gas mixture of $GeH_4$ and $SiH_4$ at a ratio $GeH_4$ to $SiH_4$ of between about 1:1 to about 1:100, with a diluent gas, such as He, $H_2$, $N_2$, or the like, at a ratio of process gas mixture to diluent gas of between about 1:100 to about 1:10, a pressure of about 1 mTorr to about 10 Torr and a temperature of about 250° C. to about 400° C. In this manner, the silicon of the $SiH_4$ selectively reacts with the cap layer 210 to form a metal silicide.

As another example, a cap layer 210 comprising a copper arsenic silicide may be formed by introducing a process gas mixture of $AsH_3$ and $SiH_4$ at a ratio of $AsH_3$ to $SiH_4$ of between about 1:1 to about 1:100 with a diluent gas, such as He, $H_2$, $N_2$, or the like, at a ratio of process gas mixture to diluent gas of between about 1:100 to about 1:10, a pressure of about 1 mTorr to about 10 Torr and a temperature of about 250° C. to about 400° C. In yet another example, a cap layer 210 comprising a copper tungsten silicide may be formed by introducing a process gas mixture of $WF_6$ and $SiH_4$ at a ratio of $WH_6$ to $SiH_4$ of between about 1:1 to about 1:10, with a diluent gas, such as He, $H_2$, $N_2$, or the like, at a ratio of process gas mixture to diluent gas of about 1:100 to about 1:10, a pressure of about 1 mTorr to about 10 Torr and a temperature of about 250° C. to about 400° C. In yet another example, a cap layer 210 comprising a copper gallium silicide may be formed by introducing a process gas mixture of $GaH_3$ and $SiH_4$ at a ratio of $GaH_3$ to $SiH_4$ of between about 1:1 to about 1:100, with a diluent gas, such as He, $H_2$, $N_2$, or the like, at a ratio of process gas mixture to diluent gas of about 1:100 to about 1:10, a pressure of about 1 mTorr to about 10 Torr and a temperature of about 250° C. to about 400° C.

In yet another embodiment, a cap layer 210 comprising a copper-metal silicide may be formed by introducing silane gas after the introduction of a metal precursor. For example, a cap layer 210 comprising a copper germanium silicide may be formed by introducing a process gas of $GeH_4$, with a diluent gas, such as He, $H_2$, $N_2$, or the like, at a ratio of process gas mixture to diluent gas of between about 1:100 to about 1:10, a pressure of about 1 mTorr to about 10 Torr and a temperature of about 250° C. to about 400° C., and then introducing silane for a time period of about 4 seconds to about 10 seconds at a pressure of about 1 mTorr to about 10 Torr and a temperature of about 250° C. to about 400° C.

As another example, a cap layer 210 comprising a copper arsenic silicide may be formed by introducing a process gas of $AsH_3$ with a diluent gas, such as He, $H_2$, $N_2$, or the like, at a ratio of process gas mixture to diluent gas of between about 1:100 to about 1:10, a pressure of about 1 mTorr to about 10 Torr and a temperature of about 250° C. to about 400° C., and then introducing silane for a time period of about 4 seconds to about 10 seconds at a pressure of about 1 mTorr to about 10 Torr and a temperature of about 250° C. to about 400° C. In yet another example, a cap layer 210 comprising a copper tungsten silicide may be formed by introducing a process gas of $WF_6$ with a diluent gas, such as He, $H_2$, $N_2$, or the like, at a ratio of process gas mixture to diluent gas of about 1:100 to about 1:10, a pressure of about 1 mTorr to about 10 Torr and a temperature of about 250° C. to about 400° C., and then introducing silane for a time period of about 4 seconds to about 10 seconds at a pressure of about 1 mTorr to about 10 Torr and a temperature of about 250° C. to about 400° C. In yet another example, a cap layer 210 comprising a copper gallium silicide may be formed by introducing a process gas of $GaH_3$ with a diluent gas, such as He, $H_2$, $N_2$, or the like, at a ratio of process gas mixture to diluent gas of about 1:100 to about 1:10, a pressure of about 1 mTorr to about 10 Torr and a temperature of about 250° C. to about 400° C., and then introducing silane for a time period of about 4 seconds to about 10 seconds at a pressure of about 1 mTorr to about 10 Torr and a temperature of about 250° C. to about 400° C.

Figure 3:
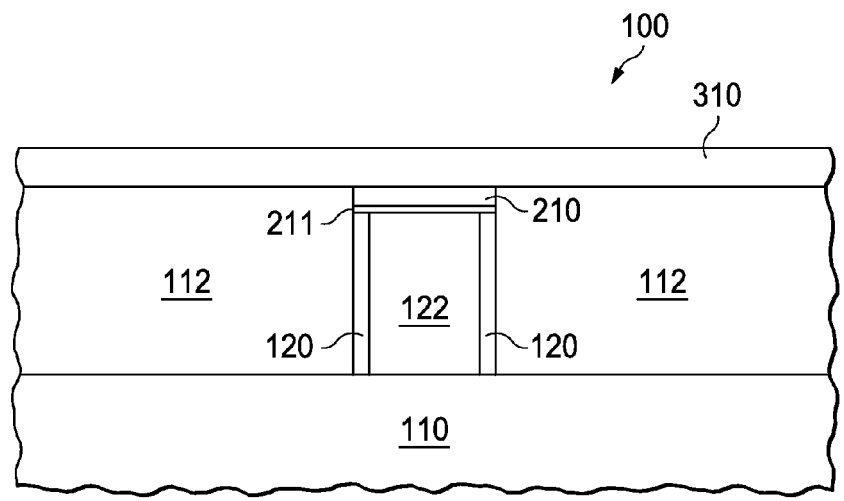

FIG. 3 illustrates the workpiece 100 after an optional etch stop layer 310 has been formed thereon in accordance with an embodiment of the present invention. In an embodiment, a pre-treatment process is performed prior to the formation of the etch stop layer 310. The pre-treatment process may be a plasma process using $H_2$, $N_2NH_3$, a mixture of $H_2/N_2H_3$, or the like at a flow rate of about 100 sccm to about 30000 sccm at a pressure of about 1 mTorr to about 100 mTorr and at power of about 200 Watts to about 1000 Watts and at a temperature of about 275° C. to about 400° C., for example.

Thereafter, the etch stop layer 310 may be formed on the surface of the first dielectric layer 112. The etch stop layer 310 is preferably formed of a dielectric material having a different etch selectivity from adjacent layers. In an embodiment, the etch stop layer 310 may be formed of SiCN, SiCO, CN, BCN, combinations thereof, or the like deposited by CVD or PECVD to a thickness of about 0 Å to about 800 Å, but more preferably about 100 Å. The etch stop layer 310 protects the underlying structures, such as the first dielectric layer 112, and also provides improved adhesion for subsequently formed layers.

Figure 4:
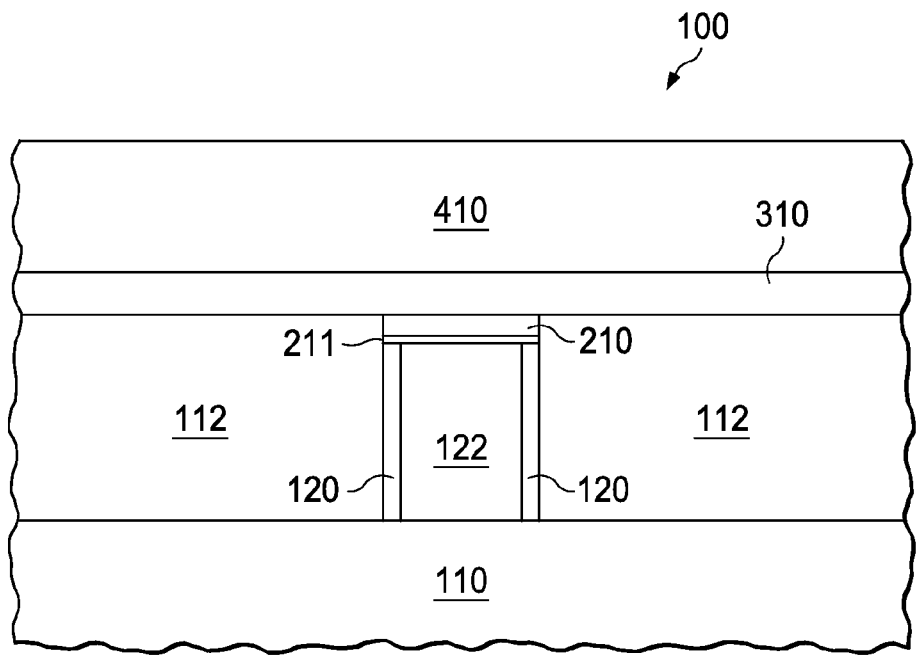

FIG. 4 illustrates the workpiece 100 after a second dielectric layer 410 has been formed in accordance with an embodiment of the present invention. The second dielectric layer 410 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art. In an embodiment, second dielectric layer 410 comprises a material similar to the first dielectric layer 112, such as an oxide that may be formed by chemical vapor deposition (CVD) techniques using tetra-ethyl-ortho-silicate (TEOS) and oxygen as a precursor. Other materials and processes may be used. It should also be noted that the second dielectric layer 410 may comprise a plurality of dielectric layers, with or without an etch stop layer formed between adjacent dielectric layers. The second dielectric layer 410 is preferably about 1000 Å to about 6000 Å in thickness, but more preferably 3000 Å.

Figure 5:
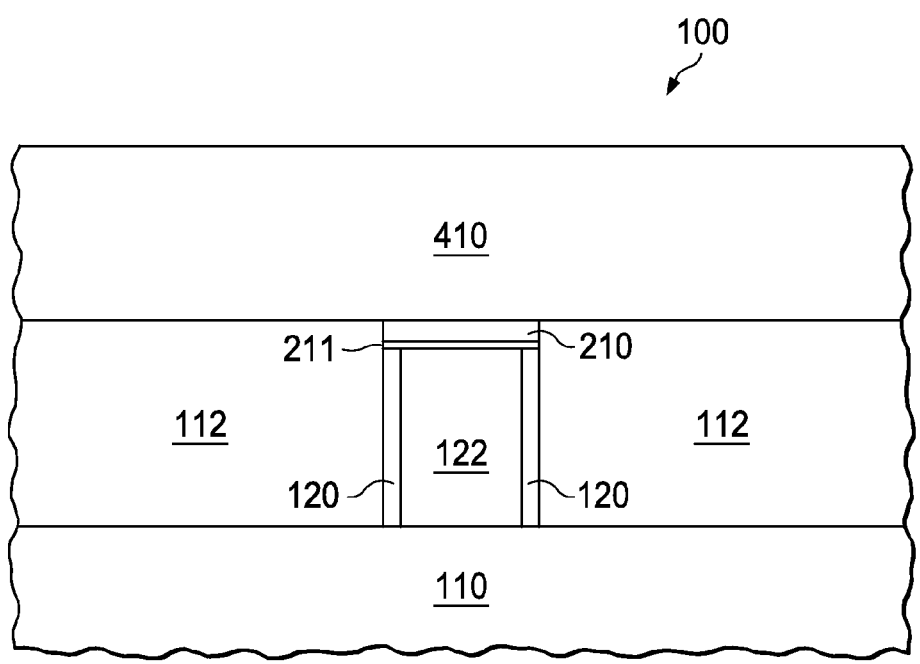

FIG. 5 illustrates the workpiece 100 without the optional etch stop layer 310 (see FIG. 3) in accordance with an embodiment of the present invention. In this embodiment, the first dielectric layer 112 and the second dielectric layer 410 may comprise the same type of material or different materials.

It should be noted that the embodiments illustrated in FIGS. 1-5 illustrate the cap layer 210 having a top surface that is coplanar with a top surface of the first dielectric layer 112 for illustrative purposes only. The conductive layer 122 may take any shape, and be formed using a single or dual damascene process.

Figure 6:
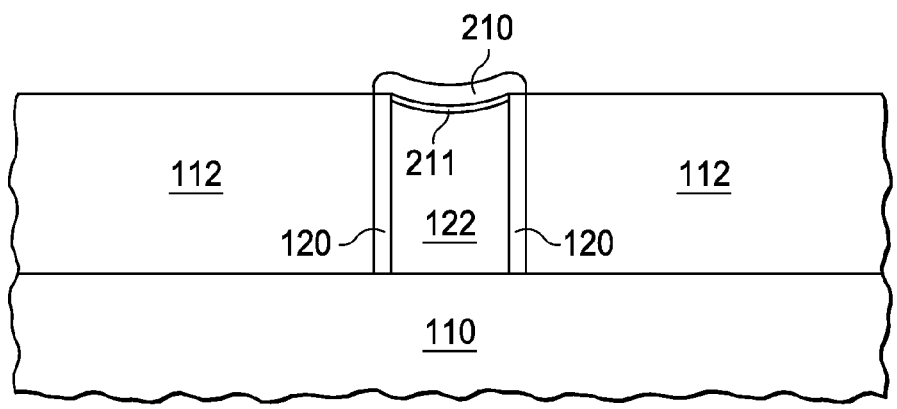
FIGS. 6-8 are cross-section views of a wafer illustrating various configurations of a cap layer in accordance with embodiments of the present invention.
Figure 7:
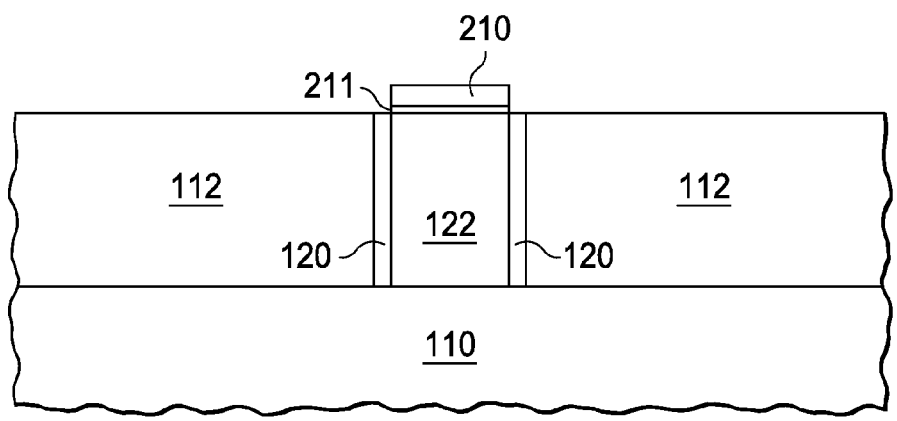
Figure 8:
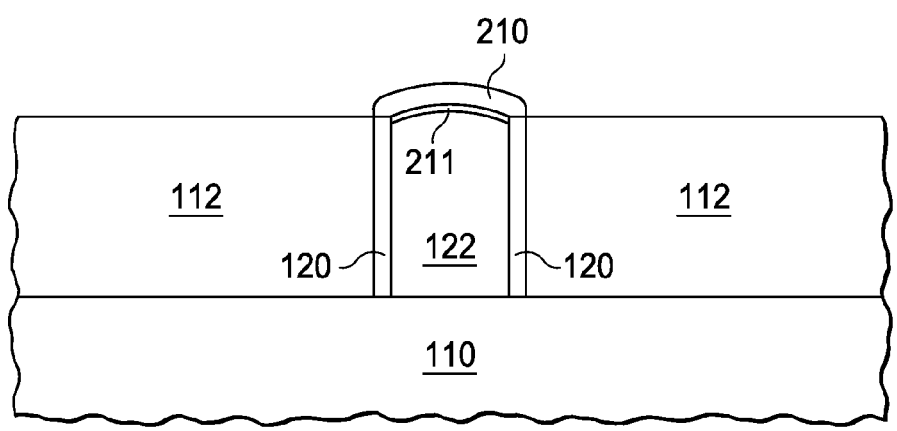

For example, FIGS. 6-8 illustrate other shapes for the conductive layer 122 and the cap layer 210. In particular, FIG. 6 illustrates the conductive layer 122 having a recess, FIG. 7 illustrates the cap layer 210 protruding above a surface of the first dielectric layer 112, and FIG. 8 illustrates the conductive layer 122 protruding above a surface of the first dielectric layer 112. Other configurations may be used.

One of ordinary skill in the art will realize that embodiments of the present invention may be utilized to form interconnections exhibiting lower line-to-line (L-L) leakage with materials coherent to current back-end-of-line (BEOL) processing materials. Furthermore, the metal/metal silicide cap layers disclosed herein exhibit improved integrity with less voids between the cap and the etch stop layer, and at a lower cost. The electromigration (EM) and time-dependent dielectric breakdown (TDDB) characteristics may also be improved.

Although the present invention and its advantages have been described in detail, it should be understood that various changes, substitutions and alterations can be made herein without departing from the spirit and scope of the invention as defined by the appended claims. For example, different types of materials and processes may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit, the method comprising:

forming a first dielectric layer on a substrate, the first dielectric layer having a conductive layer formed therein, the conductive layer comprising a first material; and forming an alloy layer on the conductive layer, the alloy layer being an alloy comprising the first material and a second material, the second material comprising germanium, arsenic, tungsten, or gallium, wherein the alloy layer comprises a metal silicide layer and the forming the alloy layer comprises introducing silane and subsequently introducing a process gas comprising germanium, arsenic, tungsten, or gallium.

2. The method of claim 1, further comprising forming a seed layer on the conductive layer prior to forming the alloy layer.

3. The method of claim 1, further comprising forming an etch stop layer on the alloy layer and the first dielectric layer.

4. The method of claim 1, wherein the forming the alloy layer comprises introducing a diluent gas comprising helium, hydrogen, or nitrogen.

5. A method of forming an integrated circuit, the method comprising:

forming a first dielectric layer on a substrate;

forming a copper layer in the first dielectric layer; and forming a copper alloy layer on the copper layer, the copper alloy layer comprising germanium, arsenic, tungsten, or gallium, wherein the copper alloy layer comprises a metal silicide layer and the forming the copper alloy layer comprises introducing silane and subsequently introducing a process gas comprising $GeH_4$, $AsH_3$, $GaH_3$, or $WF_6$.

6. The method of claim 5, wherein the forming the copper alloy layer includes forming a seed layer on the copper layer.

7. The method of claim 5, wherein the forming the copper alloy layer comprises introducing a diluent gas comprising helium, hydrogen, or nitrogen.

8. The method of claim 5, further comprising forming an etch stop layer on the copper alloy layer and the first dielectric layer.

9. A method of forming an integrated circuit, the method comprising:

forming a first dielectric layer on a substrate;

forming a copper interconnect in the first dielectric layer;

introducing a process gas comprising $GeH_4$, $AsH_3$, $GaH_3$, or $WF_6$ with a diluent gas comprising He, $H_2$, or $N_2$, thereby forming a copper-metal cap layer; and introducing silane prior to the introducing the process gas.

10. The method of claim 9, further comprising forming an etch stop layer on the copper-metal cap layer and the first dielectric layer.

* * * * *